US011525674B2

(12) United States Patent
Aimi et al.

(10) Patent No.: US 11,525,674 B2
(45) Date of Patent: Dec. 13, 2022

(54) SYSTEMS AND METHODS FOR MEASURING PROPERTIES USING BULK ACOUSTIC WAVES

(71) Applicant: General Electric Company, Schenectady, NY (US)

(72) Inventors: Marco Francesco Aimi, Niskayuna, NY (US); Joseph Alfred Iannotti, Glenville, NY (US)

(73) Assignee: General Electric Company, Schenectady, NY (US)

( * ) Notice: Subject to any disclaimer, the term of this patent is extended or adjusted under 35 U.S.C. 154(b) by 652 days.

(21) Appl. No.: 16/665,784

(22) Filed: Oct. 28, 2019

(65) Prior Publication Data
US 2021/0123730 A1 Apr. 29, 2021

(51) Int. Cl.
*G01B 17/02* (2006.01)
*H03H 9/25* (2006.01)
*H03H 9/02* (2006.01)

(52) U.S. Cl.
CPC ......... *G01B 17/02* (2013.01); *H03H 9/02551* (2013.01); *H03H 9/02866* (2013.01); *H03H 9/25* (2013.01)

(58) Field of Classification Search
CPC .............. G01B 17/02; H03H 9/02551; H03H 9/02866; H03H 9/25
USPC .......................................................... 367/99
See application file for complete search history.

(56) References Cited

U.S. PATENT DOCUMENTS

| 7,307,517 | B2 | 12/2007 | Liu et al. |
| 10,005,551 | B2 | 6/2018 | Lee et al. |
| 10,200,089 | B2 | 2/2019 | Lee et al. |
| 10,225,026 | B2 | 3/2019 | Lee et al. |
| 11,421,986 | B2 * | 8/2022 | Shen ........................ G01B 7/10 |
| 2007/0028692 | A1 | 2/2007 | Liu |
| 2017/0167287 | A1 | 6/2017 | Jacobs et al. |

(Continued)

OTHER PUBLICATIONS

Chi-Yuan Lee et al., "In-situ monitoring of thickness of quartz membrane during batch chemical etching using a novel micromachined acoustic wave sensor", IEEE International Frequency Control Symposium 2003. (Year: 2003).*

(Continued)

*Primary Examiner* — Hafizur Rahman
(74) *Attorney, Agent, or Firm* — Fitch, Even, Tabin & Flannery LLP

(57) ABSTRACT

A measuring system is disclosed. The measuring system includes a surface acoustic wave (SAW) device including a piezoelectric substrate and a first and second electrode disposed on a surface of the piezoelectric substrate, and a measuring device communicatively coupled to the first electrode via a first probe and the second electrode via a second probe and configured to apply an electrical signal to the first and second electrode to generate an incident bulk acoustic wave within the piezoelectric substrate, detect at least a first reflected bulk acoustic wave and a second reflected bulk acoustic wave at the first and second electrode, and calculate a thickness between a first interface corresponding to the first reflected bulk acoustic wave and a second interface corresponding to the second reflected bulk acoustic wave based on a time elapsed between detecting the first and second reflected bulk acoustic waves.

20 Claims, 3 Drawing Sheets

(56) References Cited

U.S. PATENT DOCUMENTS

2021/0013864 A1* 1/2021 Goto ................. H03H 9/02559
2021/0111698 A1* 4/2021 Uno ........................ H03H 9/25

OTHER PUBLICATIONS

Jakoby et al., "The Potential of Microacoustic SAW- and BAW-Based Sensors for Automotive Applications—A Review", IEEE Sensors Journal, vol. 05, Issue No. 02, pp. 443-452, Oct. 2002.

Kalinin et al., "Application of Passive SAW Resonant Sensors to Contactless Measurement of the Output Engine Torque in Passenger Cars", IEEE International Frequency Control Symposium Joint with the 21st European Frequency and Time Forum, pp. 499-504, Jun. 1, 2007.

Wilson et al., "SAW Sensor for Fastener Failure Detection", Sensors, 2010 IEEE, pp. 2307-2310, Kona, HI, USA, Nov. 1-4, 2010.

Kalinin et al., "Resonant SAW Torque Sensor for Wind Turbines", 2013 Joint European Frequency and Time Forum & International Frequency Control Symposium (EFTF/IFC), pp. 462-465, Prague, Czech Republic, Jul. 21-25, 2013.

\* cited by examiner

SYSTEMS AND METHODS FOR MEASURING PROPERTIES USING BULK ACOUSTIC WAVES

BACKGROUND

The field of the invention relates generally to measuring devices, and more particularly, to a system and method for measuring properties based on interactions of a bulk acoustic wave (BAW) within a surface acoustic wave (SAW) device.

SAW devices rely on surface acoustic waves on a piezoelectric substrate between interdigitated transducers to provide a number of different functions. For example, SAW devices may serve as filters, oscillators, or sensors that detect, for example, pressure, torque, or temperature. In operation, SAW devices are at times mounted upon another structure, for example to detect properties of the structure, such as strain or torque. Mounting of the SAW device may be done using a bond material such as an adhesive attachment film. Such bond materials may perform better when the bond material has a certain range of thickness. For example, a bond material that is too thin or too thick may be less durable and/or hinder the ability of the SAW device to detect properties of the structure on which it is mounted. Accordingly, the ability to accurately measure the thickness of the bond material prior to mounting the SAW device facilitates improving quality control of SAW devices. However, because, for example, the attachment layer is relatively thin and formed onto the SAW device, at least some known methods of measurement are relatively inaccurate in measuring the thickness of the bond material. An improved system for measuring the thickness of bond material is therefore desirable.

BRIEF DESCRIPTION

In one aspect, a measuring system is disclosed. The measuring system includes a surface acoustic wave (SAW) device that includes a piezoelectric substrate and a plurality of electrodes including a first electrode and a second electrode. The plurality of electrodes is disposed on a first surface of the piezoelectric substrate. A bond material is attached to a second surface of the piezoelectric substrate opposite the first surface. The measuring system further includes a measuring device communicatively coupled to the first electrode via a first probe and the second electrode via a second probe. The measuring device includes at least one processor in communication with at least one memory device. The at least one processor is configured to apply an electrical signal to the first electrode and the second electrode to generate an incident bulk acoustic wave within the piezoelectric substrate, detect at least a first reflected bulk acoustic wave and a second reflected bulk acoustic wave at the first electrode and the second electrode, and calculate a thickness between a first interface corresponding to the first reflected bulk acoustic wave and a second interface corresponding to the second reflected bulk acoustic wave based on a time elapsed between detecting the first reflected bulk acoustic wave and the second reflected bulk acoustic wave.

In another aspect, a measuring device for measuring thickness with a surface acoustic wave (SAW) device is disclosed. The SAW device includes a piezoelectric substrate, a plurality of electrodes disposed on a first surface of the piezoelectric substrate, and a bond material attached to a second surface opposite the first surface of the piezoelectric substrate. The measuring device is communicatively coupled to a first electrode of the plurality of electrodes via a first probe and a second electrode of the plurality of electrodes via a second probe. The measuring device includes at least one processor in communication with at least one memory device. The at least one processor is configured to apply an electrical signal to the first electrode and the second electrode to generate an incident bulk acoustic wave within the piezoelectric substrate, detect at least a first reflected bulk acoustic wave and a second reflected bulk acoustic wave at the first electrode and the second electrode, and calculate a thickness between a first interface corresponding to the first reflected bulk acoustic wave and a second interface corresponding to the second reflected bulk acoustic wave based on a time elapsed between detecting the first reflected bulk acoustic wave and the second reflected bulk acoustic wave.

In another aspect, a method for measuring thickness with a surface acoustic wave (SAW) device is disclosed. The SAW device includes a piezoelectric substrate, a plurality of electrodes disposed on a first surface of the piezoelectric substrate, and a bond material attached to a second surface opposite the first surface of the piezoelectric substrate. The method is performed by a measuring device that includes at least one processor in communication with at least one memory device. The method includes applying, by the measuring device, an electrical signal to a first electrode of the plurality of electrodes and a second electrode of the plurality of electrodes to generate an incident bulk acoustic wave within the piezoelectric substrate, detecting, by the measuring device, at least a first reflected bulk acoustic wave and a second reflected bulk acoustic wave at the first electrode and the second electrode, and calculating, by the measuring device, a thickness between a first interface corresponding to the first reflected bulk acoustic wave and a second interface corresponding to the second reflected bulk acoustic wave based on a time elapsed between detecting the first reflected bulk acoustic wave and the second reflected bulk acoustic wave.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 1:
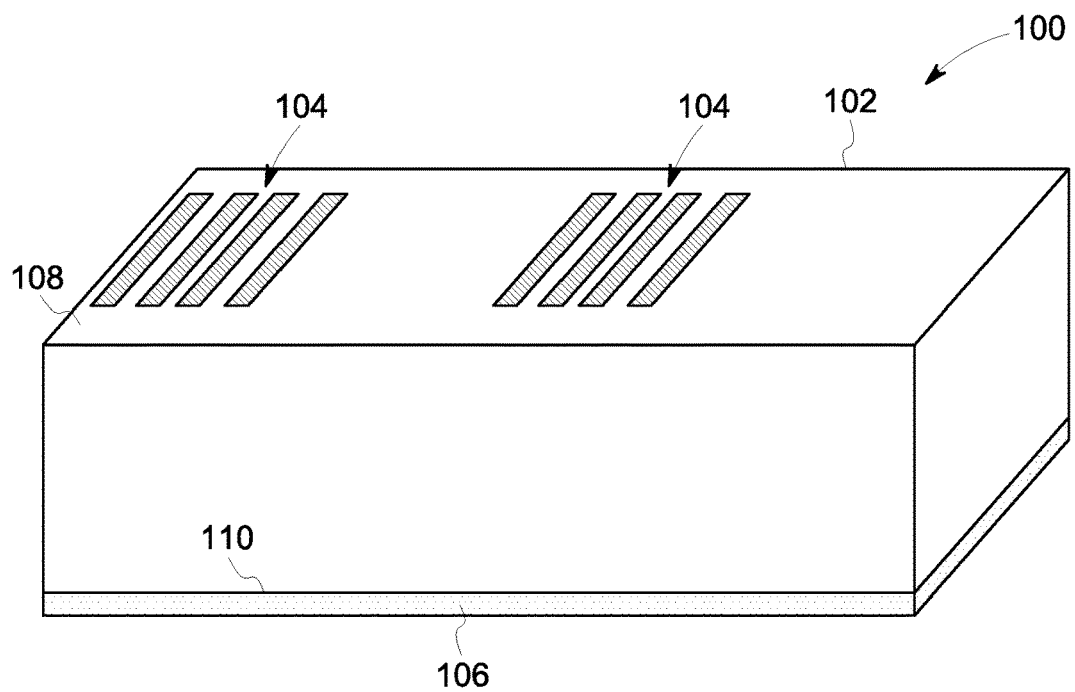
FIG. 1 depicts an exemplary surface acoustic wave (SAW) device.

FIG. 1 depicts an exemplary surface acoustic wave (SAW) device 100. SAW device 100 includes a piezoelectric substrate 102, one or more electrodes 104, and a bond material 106. In some embodiments, piezoelectric substrate includes and/or is formed from quartz, aluminum nitride (AlN), zinc oxide (ZnO), and/or another piezoelectric material. In some embodiments, electrodes 104 are formed from a conductive material and are disposed on a first surface 108 of piezoelectric substrate 102. Electrical signals may be applied to electrodes 104 to excite piezoelectric substrate 102 to form a surface acoustic wave on a surface of piezoelectric substrate 102. A response of SAW device 100 to the electrical signals may be analyzed to determine properties of SAW device 100 and/or, for example, an external object attached to SAW device 100. Examples of such properties include pressure, strain, torque, temperature, and/or other properties. Bond material 106 is attached to piezoelectric substrate 102 and may be used to attach SAW device 100 to the external object. In some embodiments, bond material 106 is an adhesive attachment film. Additionally or alternatively, bond material 106 may be solder, another bonding material, and/or a combination thereof. In some embodiments, bond material 106 is disposed on a second surface 110 of piezoelectric substrate 102 opposite first surface 108. In some embodiments, SAW device 100 is communicatively coupled to an external network wirelessly. For example, electrodes 104 may include and/or be electrically coupled to one or more antennas.

Figure 2:
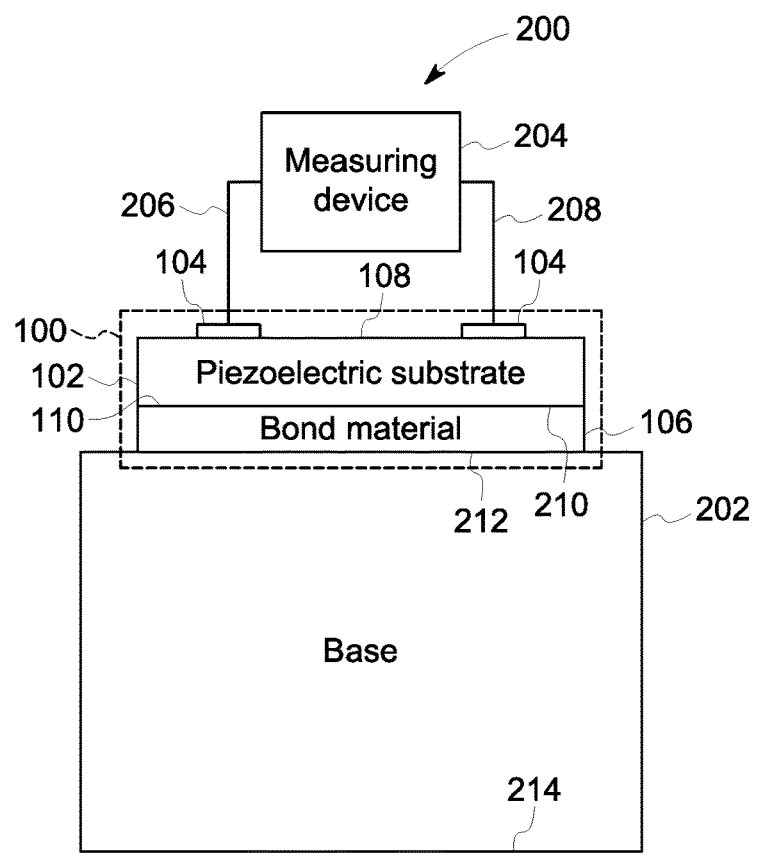
FIG. 2 depicts a schematic diagram of an exemplary system for measuring properties of a SAW device such as the SAW device illustrated in FIG. 1.
Figure 3:
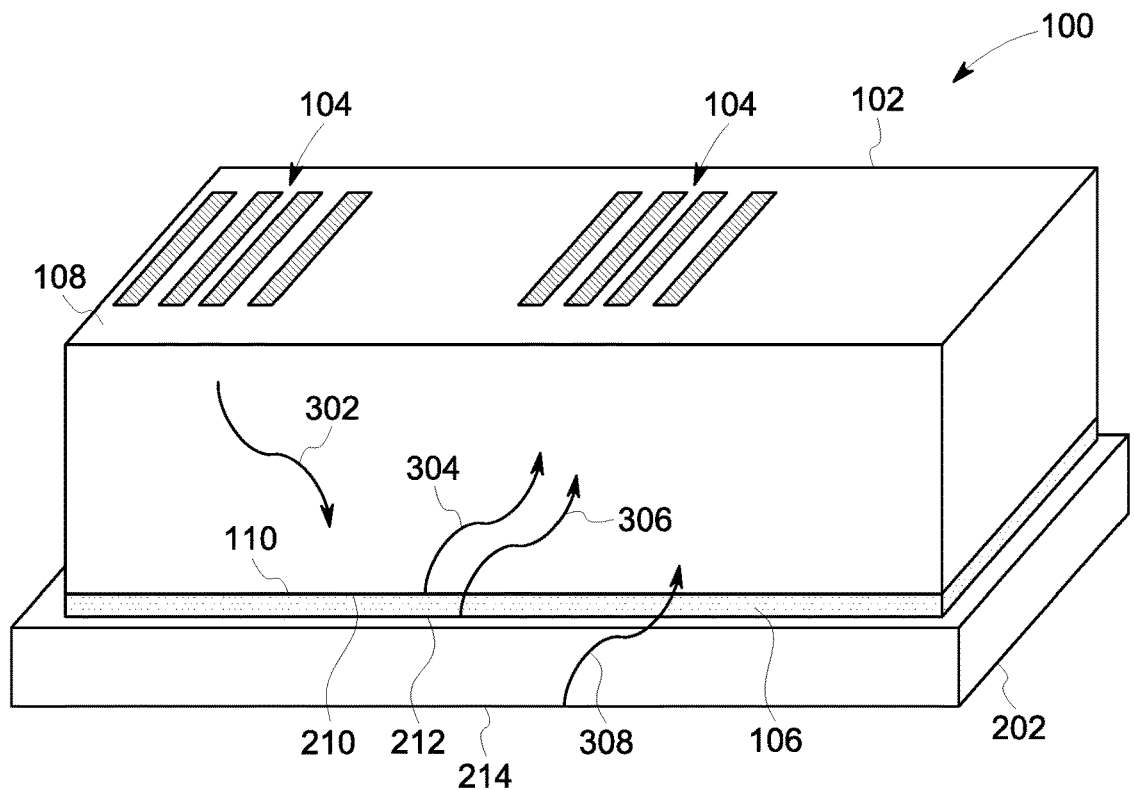
FIG. 3 depicts an exemplary pattern of bulk acoustic wave (BAW) propagation within the SAW device illustrated in FIG. 1.

FIG. 2 depicts an exemplary system 200 for determining a thickness of bond material 106. System 200 includes SAW device 100, a base structure 202, a measuring device 204, a first probe 206, and a second probe 208. FIG. 3 depicts a propagation pattern of bulk acoustic waves within piezoelectric substrate 102, bond material 106, and base structure 202 during a measurement process using system 200.

Base structure 202 is configured to support SAW device 100, for example, during measurement processes and/or during operation of SAW device 100. In some embodiments, base structure 202 may be a structure on which SAW device 100 is temporarily or permanently installed, for example, such that SAW device 100 may measure properties of base structure 202. Base structure 202 may be formed from a conductive and/or a non-conductive material. SAW device 100 is disposed upon base structure 202 such that bond material 106 is adjacent to, although not necessarily adhered to, base structure 202.

Measuring device 204 is communicatively coupled to one or more electrodes 104 through first probe 206 and second probe 208, respectively, such that SAW device 100 forms an electrical network between first probe 206 and second probe 208. In some embodiments, first probe 206 and second probe 208 may include lead wires, coaxial cables, antennas, waveguides, other components for transmitting electrical signals, and/or any combination thereof.

Measuring device 204 is configured to apply an electrical signal to SAW device 100 across first probe 206 and second probe 208. When an electrical signal such as a pulse is applied to the electrodes 104 coupled to first probe 206 and second probe 208, an incident bulk acoustic wave 302 is generated in piezoelectric substrate 102. The generated incident bulk acoustic wave 302 may reflect, for example, at a first interface 210 between piezoelectric substrate 102 and bond material 106 to produce a first reflected bulk acoustic wave 304. Incident bulk acoustic wave 302 may further reflect, for example, at a second interface 212 between bond material 106 and base structure 202 to produce a second reflected bulk acoustic wave 306. Measuring device 204 is further configured to detect first reflected bulk acoustic wave 304 and second reflected bulk acoustic wave 306 and measure a time elapsed between the detection of first reflected bulk acoustic wave 304 and second reflected bulk acoustic wave 306 at first probe 206 and second probe 208. In some embodiments, measuring device 204 may detect additional reflected bulk acoustic waves, such as a third reflected bulk acoustic wave 308 corresponding to a third interface 214, wherein the third interface 214 is a surface of base structure 202 opposite second interface 212

Measuring device 204 is further configured to compute, based on the measured time elapsed, between first reflected bulk acoustic wave 304 and second reflected bulk acoustic wave 306, a thickness of bond material 106. For example, the bulk acoustic waves may have known respective speeds of propagation within piezoelectric substrate 102 and within bond material 106 that may be used, with the measured time delay, to calculate the thickness of bond material 106. In some embodiments, measuring device 204 is configured to apply a formula or lookup table defining a mathematical relationship between time elapsed between first reflected bulk acoustic wave 304 and second reflected bulk acoustic wave 306 being detected at electrodes 104 and the thickness of bond material 106. In some embodiments, measuring device 204 is further configured to measure other properties of first reflected bulk acoustic wave 304 and second reflected bulk acoustic wave 306 to determine the thickness of bond material 106 such as, for example, amplitude. In some embodiments, measuring device is further configured to compute, for example, a thickness of base structure 202 based on a time elapsed between detecting second reflected bulk acoustic wave 306 and third reflected bulk acoustic wave 308. In further embodiments, measuring device 204 may be configured to compute other distances within system 200 in a similar manner.

In some embodiments, measuring device 204 is further configured to determine that an alert condition is present based on the calculated thickness. For example, measuring device 204 may determine that the alert condition is present if the calculated thickness falls outside a certain specified range. In some such embodiments, measuring device 204 may compare the calculated thickness to a previously calculated thickness to determine, for example, whether the thickness has changed over time.

Figure 4:
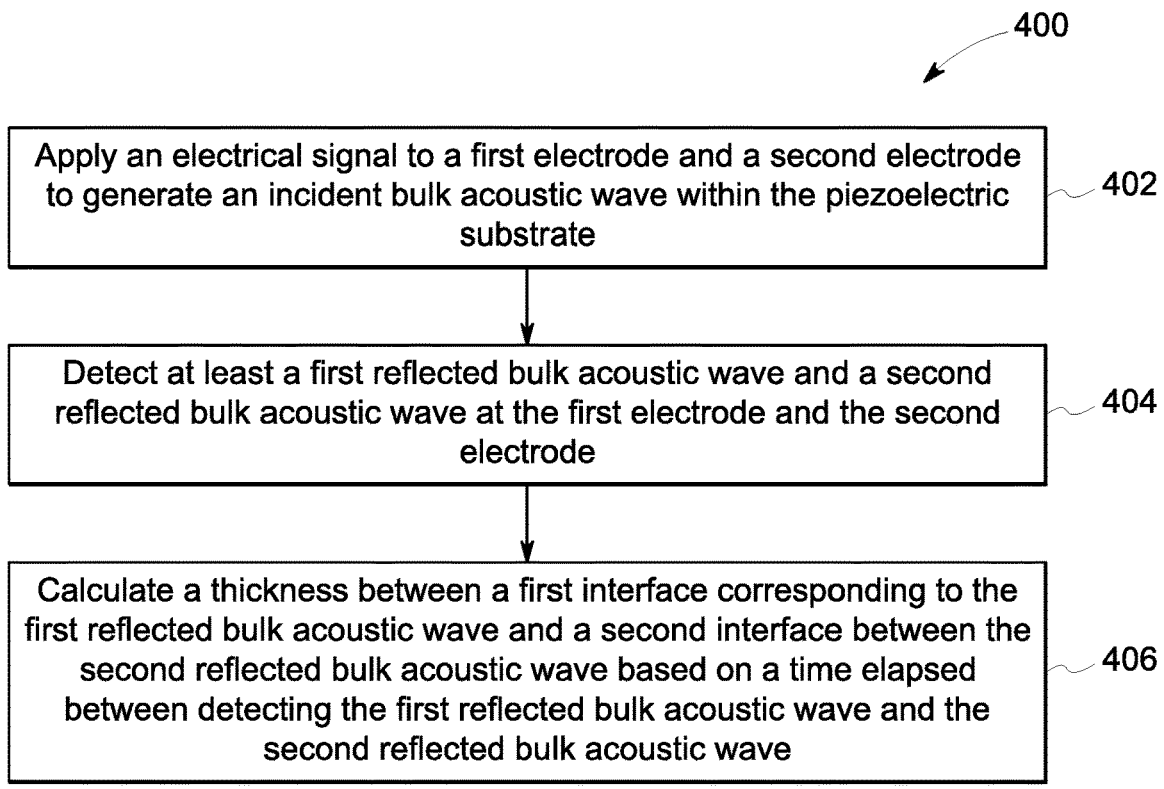
FIG. 4 depicts an exemplary method of measuring a thickness of a bond material that may be performed using the system illustrated in FIG. 2.

FIG. 4 illustrates an exemplary method 400 for measuring a thickness of bond material 106 of SAW device 100. In some embodiments, method 400 is performed by measuring device 204. Method 400 includes applying 402 an electrical signal to a first electrode and a second electrode (such as electrodes 104) to generate an incident bulk acoustic wave (such as incident bulk acoustic wave 302) within a piezoelectric substrate (such as piezoelectric substrate 102). Method 400 further includes detecting 404 at least a first reflected bulk acoustic wave (such as first reflected bulk acoustic wave 304) and a second reflected bulk acoustic wave (such as second reflected bulk acoustic wave 306) at the first electrode and the second electrode. Method 400 further includes calculating 406 a thickness between a first interface (such as first interface 210) corresponding to the first reflected bulk acoustic wave and a second interface (such as second interface 212) between the second reflected bulk acoustic wave based on a time elapsed between detecting the first reflected bulk acoustic wave and the second reflected bulk acoustic wave.

Figure 5:
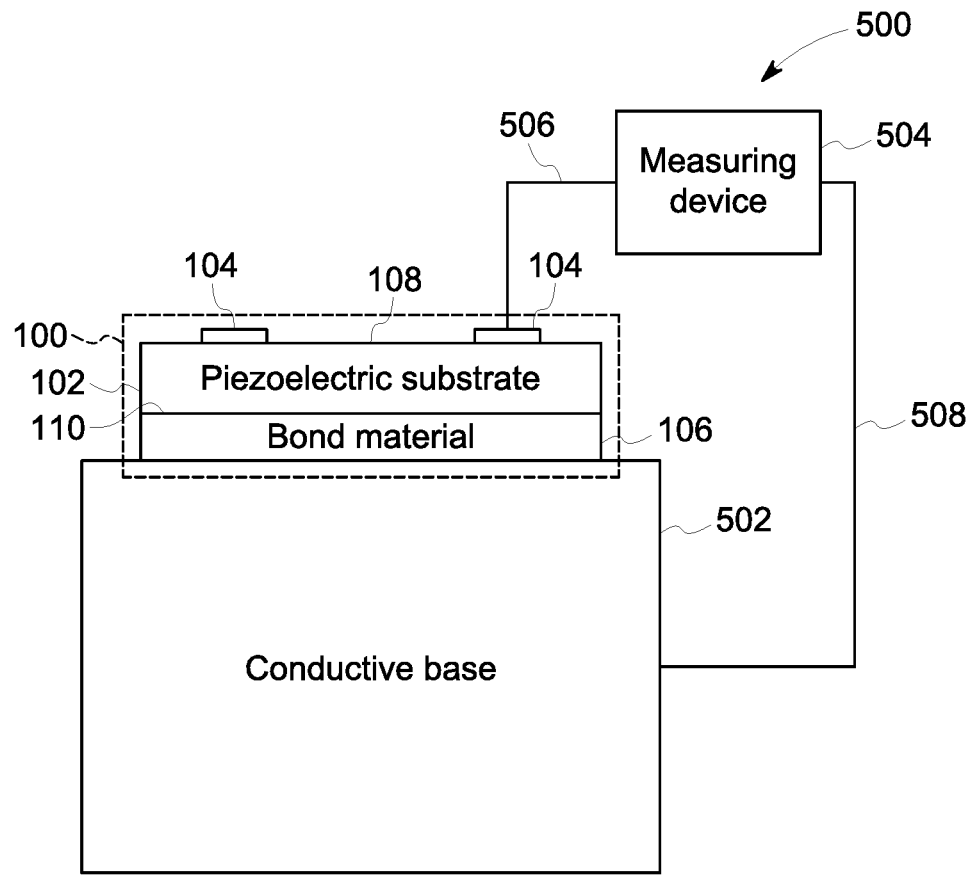
FIG. 5 depicts another exemplary system for measuring properties of a SAW device such as the SAW device illustrated in FIG. 1.

FIG. 5 depicts another exemplary system 500 for measuring a thickness of bond material 106. System 500 includes SAW device 100, a conductive base structure 502, a measuring device 504, a first probe 506, and a second probe 508.

Conductive base structure 502 is formed from a conductive material such as, for example, steel, and is configured to support SAW device 100. SAW device 100 is disposed upon conductive base structure 502 such that bond material 106 is in contact with conductive base structure 502. In some embodiments, bond material 106 is not adhered to conductive base structure 502. For example, conductive base structure 502 may be configured for testing SAW device 100 prior to installation, such that SAW device 100 is temporarily placed on conductive base structure 502. Additionally or alternatively, bond material 106 may be adhered to conductive base structure 502. For example, conductive base structure 502 may be a structure on which SAW device 100 is installed. In some embodiments, conductive base structure 502 is substantially similar to base structure 202 (shown in FIG. 2).

Measuring device 504 is communicatively coupled to at least one of electrodes 104 and to conductive base structure 502 through first probe 506 and second probe 508, respectively. In some embodiments, first probe 506 and second probe 508 may include lead wires, coaxial cables, antennas, waveguides, other components for transmitting electrical signals, and/or any combination thereof. In some embodiments, first probe 506 and second probe 508 are substantially similar to first probe 206 and second probe 208 (shown in FIG. 2). SAW device 100 and conductive base structure 502 form an electrical network between first probe 506 and second probe 508 that is capable of functioning as a bulk acoustic wave (BAW) resonator. When excited by an electrical signal, bulk acoustic waves propagate through piezoelectric substrate 102 and bond material 106 such that the BAW resonator oscillates at a specific resonant frequency. The resonant frequency depends in part on the combined thickness of piezoelectric substrate 102 and bond material 106. Accordingly, by measuring the resonant frequency between first probe 506 and second probe 508, the combined thickness of piezoelectric substrate 102 and bond material 106 may be determined by measuring device 504.

Measuring device 504 is configured to measure a resonant frequency between first probe 506 and second probe 508. For example, measuring device 204 may measure an admittance between first probe 506 and second probe 508 over a range of frequencies and identify a frequency corresponding to a maximum admittance as the resonant frequency. Admittance is a measure of how easily a circuit allows a current to flow, for example, at a given voltage having a given frequency, and is a reciprocal of an impedance of the respective circuit.

Measuring device 504 is further configured to compute a thickness of bond material 106 based on the measured resonant frequency. Because the resonant frequency is proportional to the combined thickness of piezoelectric substrate 102 and bond material 106, the combined thickness can be determined based on the measured resonant frequency, for example, by applying a formula or lookup table defining a mathematical relationship between the combined thickness and the resonant frequency. In some embodiments, piezoelectric substrate 102 has a known thickness. For example, piezoelectric substrate 102 may be manufactured to a specific thickness specification. In such embodiments, measuring device 504 may determine the thickness of bond material 106 by subtracting the known thickness of piezoelectric substrate 102 from the determined combined thickness of piezoelectric substrate 102 and bond material 106.

Figure 6:
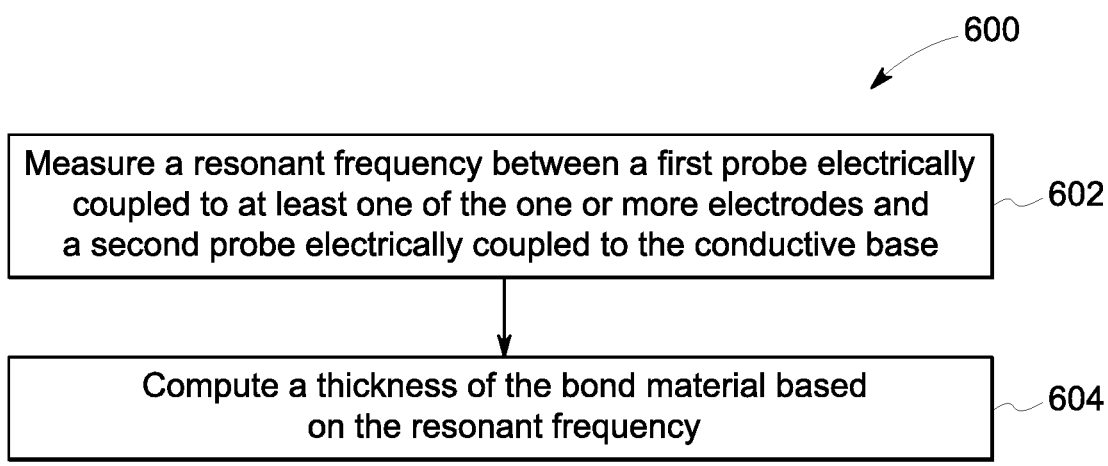
FIG. 6 depicts another exemplary method of measuring a thickness of a bond material that may be performed using the system illustrated in FIG. 5.

FIG. 6 illustrates an exemplary method 600 for measuring a thickness of bond material 106 of SAW device 100. In some embodiments, method 600 is performed by measuring device 504. Method 600 includes measuring 602 a resonant frequency between a first probe (such as first probe 506) electrically coupled to at least one or more electrodes (such as electrodes 104) and a second probe (such as second probe 508) electrically coupled to a conductive base structure (such as conductive base structure 502). Method 600 may further include computing 604 a thickness of bond material 106 based on the measured resonant frequency.

The embodiments described herein include a measuring system including a surface acoustic wave (SAW) device that includes a piezoelectric substrate and a plurality of electrodes including a first electrode and a second electrode. The plurality of electrodes is disposed on a first surface of the piezoelectric substrate. A bond material is attached to a second surface of the piezoelectric substrate opposite the first surface. The measuring system further includes a measuring device communicatively coupled to the first electrode via a first probe and the second electrode via a second probe. The measuring device includes at least one processor in communication with at least one memory device. The processor is configured to apply an electrical signal to the first electrode and the second electrode to generate an incident bulk acoustic wave within the piezoelectric substrate, detect at least a first reflected bulk acoustic wave and a second reflected bulk acoustic wave at the first electrode and the second electrode, and calculate a thickness between a first interface corresponding to the first reflected bulk acoustic wave and a second interface between the second reflected bulk acoustic wave based on a time elapsed between detecting the first reflected bulk acoustic wave and the second reflected bulk acoustic wave.

An exemplary technical effect of the methods, systems, and apparatus described herein includes at least one of: (a) an ability to accurately measure a thickness of an bond material for a SAW device using bulk acoustic waves by measuring a resonant frequency for bulk acoustic waves in the SAW device; (b) an ability to accurately measure a thickness of an bond material for a SAW device using bulk acoustic waves by applying an electrical pulse to the SAW device and measuring a time elapsed between a first and a second reflected bulk acoustic wave in the SAW device, and (c) improving quality control of SAW devices by accurately measuring a thickness of an bond material to ensure that the thickness falls within a desired range for installing and operating the SAW device.

Exemplary embodiments of a system for measuring a thickness of a bond material are described herein. The systems and methods of operating and manufacturing such systems and devices are not limited to the specific embodiments described herein, but rather, components of systems and/or steps of the methods may be utilized independently and separately from other components and/or steps described herein. For example, the methods may also be used in combination with other electronic systems, and are not limited to practice with only the electronic systems, and methods as described herein. Rather, the exemplary embodiment can be implemented and utilized in connection with many other electronic systems.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A measuring system comprising:
   a surface acoustic wave (SAW) device comprising:
      a piezoelectric substrate; and
      a plurality of electrodes comprising a first electrode and a second electrode, the plurality of electrodes disposed on a first surface of said piezoelectric substrate, wherein a bond material is attached to a second surface of said piezoelectric substrate opposite the first surface; and
   a measuring device communicatively coupled to said first electrode via a first probe and said second electrode via a second probe, said measuring device comprising at least one processor in communication with at least one memory device, said at least one processor configured to:
      apply an electrical signal to said first electrode and said second electrode to generate an incident bulk acoustic wave within the piezoelectric substrate;
      detect at least a first reflected bulk acoustic wave and a second reflected bulk acoustic wave at said first electrode and said second electrode; and
      calculate a thickness between a first interface corresponding to the first reflected bulk acoustic wave and a second interface corresponding to the second reflected bulk acoustic wave based on a time elapsed between detecting the first reflected bulk acoustic wave and the second reflected bulk acoustic wave.

2. The measuring system of claim 1, wherein the thickness corresponds to the bond material, wherein the first interface corresponds to an interface between the piezoelectric substrate and the bond material, and wherein the second interface corresponds to an interface between the bond material and a base structure.

3. The measuring system of claim 1, wherein the thickness corresponds to a thickness of a base structure, wherein the first interface corresponds to an interface between the bond material and the base structure, and wherein the second interface corresponds to an opposite surface of the base structure.

4. The measuring system of claim 3, wherein the bond material is attached to the base structure at the first interface.

5. The measuring system of claim 1, wherein to compute the thickness, said at least one processor is configured to compute the thickness based at least in part on an expected propagation velocity through one or more of said piezoelectric substrate and the bond material.

6. The measuring system of claim 1, wherein said piezoelectric substrate comprises quartz.

7. The measuring system of claim 1, wherein said SAW device further comprises an antenna.

8. The measuring system of claim 1, wherein said at least one processor is further configured to determine, based on the computed thickness, that an alert condition is present.

9. The measuring system of claim 8, wherein to determine that an alert condition is present, said at least one processor is configured to compare a difference between the computed thickness and an expected thickness to a tolerance threshold.

10. The measuring system of claim 9, wherein the expected thickness is a previously computed thickness corresponding to the first interface and the second interface.

11. A measuring device for measuring thickness with a surface acoustic wave (SAW) device, the SAW device including a piezoelectric substrate, a plurality of electrodes disposed on a first surface of the piezoelectric substrate, and a bond material attached to a second surface opposite the first surface of the piezoelectric substrate, said measuring device communicatively coupled to a first electrode of the plurality of electrodes via a first probe and a second electrode of the plurality of electrodes via a second probe, said measuring device comprising at least one processor in communication with at least one memory device, said at least one processor configured to:
   apply an electrical signal to the first electrode and the second electrode to generate an incident bulk acoustic wave within the piezoelectric substrate;
   detect at least a first reflected bulk acoustic wave and a second reflected bulk acoustic wave at the first electrode and the second electrode; and
   calculate a thickness between a first interface corresponding to the first reflected bulk acoustic wave and a second interface corresponding to the second reflected bulk acoustic wave based on a time elapsed between detecting the first reflected bulk acoustic wave and the second reflected bulk acoustic wave.

12. The measuring device of claim 11, wherein the thickness corresponds to the bond material, wherein the first interface corresponds to an interface between the piezoelectric substrate and the bond material, and wherein the second interface corresponds to an interface between the bond material and a base structure.

13. The measuring device of claim 11, wherein the thickness corresponds to a thickness of a base structure, wherein the first interface corresponds to an interface between the bond material and the base structure, and wherein the second interface corresponds to an opposite surface of the base structure.

14. The measuring device of claim 13, wherein the bond material is attached to the base structure at the first interface.

15. The measuring device of claim 11, wherein to compute the thickness, said at least one processor is configured to compute the thickness based at least in part on an expected propagation velocity through one or more of the piezoelectric substrate and the bond material.

16. The measuring device of claim 11, wherein the piezoelectric substrate is quartz.

17. The measuring device of claim 11, wherein the SAW device further includes an antenna.

18. The measuring device of claim 11, wherein said at least one processor is further configured to determine, based on the computed thickness, that an alert condition is present.

19. The measuring device of claim 18, wherein to determine that an alert condition is present, said processor is configured to compare a difference between the computed thickness and an expected thickness to a tolerance threshold.

20. A method for measuring thickness with a surface acoustic wave (SAW) device, the SAW device including a piezoelectric substrate, a plurality of electrodes disposed on a first surface of the piezoelectric substrate, and an bond material attached to a second surface opposite the first surface of the piezoelectric substrate, said method performed by a measuring device including at least one processor in communication with at least one memory device, said method comprising:
  applying, by the measuring device, an electrical signal to a first electrode of the plurality of electrodes and a second electrode of the plurality of electrodes to generate an incident bulk acoustic wave within the piezoelectric substrate;
  detecting, by the measuring device, at least a first reflected bulk acoustic wave and a second reflected bulk acoustic wave at the first electrode and the second electrode; and
  calculating, by the measuring device, a thickness between a first interface corresponding to the first reflected bulk acoustic wave and a second interface corresponding to the second reflected bulk acoustic wave based on a time elapsed between detecting the first reflected bulk acoustic wave and the second reflected bulk acoustic wave.

\* \* \* \* \*